United States Patent [19]

Thijs et al.

[11] Patent Number: 5,399,885
[45] Date of Patent: Mar. 21, 1995

[54] OPTOELECTRONIC SEMICONDUCTOR DEVICE HAVING PLURAL MESAS

[75] Inventors: Petrus J. A. Thijs; Aart Van Leerdam; Johannes J. M. Binsma, all of Eindhoven, Netherlands

[73] Assignee: U.S. Philips Corporation, New York, N.Y.

[21] Appl. No.: 191,070

[22] Filed: Feb. 3, 1994

Related U.S. Application Data

[63] Continuation of Ser. No. 105,653, Aug. 12, 1993, abandoned, which is a continuation of Ser. No. 848,614, Mar. 9, 1992, abandoned.

[30] Foreign Application Priority Data

Mar. 15, 1991 [EP] European Pat. Off. ............ 91200562

[51] Int. Cl.$^6$ .............................................. H01L 33/00
[52] U.S. Cl. .......................................... 257/95; 257/96; 257/622; 257/623; 372/46; 372/48; 372/50
[58] Field of Search .................. 257/466, 95, 187, 96, 257/622, 623; 372/48, 50, 46; 385/8, 14

[56] References Cited

U.S. PATENT DOCUMENTS

| | | | |
|---|---|---|---|
| 3,270,235 | 8/1966 | Loebner | 257/95 X |
| 3,457,633 | 7/1969 | Marinace et al. | 257/623 X |
| 4,110,661 | 8/1978 | Harris, Jr. et al. | 257/95 X |
| 4,356,341 | 10/1982 | Borden et al. | 257/466 X |
| 4,385,389 | 5/1983 | Botez | 372/48 |
| 4,862,474 | 8/1989 | Morinaga et al. | 257/623 X |
| 5,260,588 | 11/1993 | Ohta et al. | 257/95 X |

FOREIGN PATENT DOCUMENTS 0472221 2/1992 European Pat. Off. .
63-090879 4/1988 Japan .

Primary Examiner—William Mintel
Attorney, Agent, or Firm—Steven R. Biren

[57] ABSTRACT

Optoelectronic semiconductor devices including a semiconductor body with a semiconductor substrate and a substantially plane semiconductor layer structure of III-V semiconductor materials situated thereon, a mesa being formed at a surface of the semiconductor body by means of selective deposition and forming part of an optoelectronic element, are important components in optical communication and optical disc systems or bar code readers. The optoelectronic element often is a semiconductor diode laser, but may alternatively be, for example, a radiation guide. A disadvantage of the known devices is that parasitic deposition takes place next to the mesa during the selective deposition. In addition, the device often contains so-called cleavage steps near the mesa. Another disadvantage is that the height and flatness of the upper side of the mesa are not accurately controllable. According to the invention, a second mesa is present at at least two opposing sides of the mesa, separated from the first mesa by a groove, the surface area of the second mesa in plan view being much greater than the surface area of the first mesa, which second mesa is also formed by means of selective deposition and simultaneously with the first mesa. In this configuration, less parasitic deposition takes place than expected and there is less damage near the first mesa after cleaving. When the distance between the first mesa and the second mesa is chosen to be sufficiently small, it is also found that the flatness and height of the first mesa are accurately controllable.

10 Claims, 2 Drawing Sheets

OPTOELECTRONIC SEMICONDUCTOR DEVICE HAVING PLURAL MESAS

This is a continuation of application Ser. No. 08/105,653, filed Aug. 12, 1993, which is a continuation of Ser. No. 07/848,614, filed Mar. 9, 1992, both now abandoned.

BACKGROUND OF THE INVENTION

The invention relates to an optoelectronic semiconductor device with an optoelectronic element comprising a semiconductor body with a semiconductor substrate and a superimposed, substantially plane semiconductor layer structure of III-V semiconductor materials, a mesa being formed at a surface of the semiconductor body by means of selective deposition and forming part of the optoelectronic element. The invention also relates to a method of manufacturing an optoelectronic semiconductor device comprising an optoelectronic element.

Such semiconductor devices are widely used in optical telecommunication, optical disc systems, etc. The optical element often is a semiconductor diode laser or LED, but it may alternatively comprise, for example, a (passive) radiation guide or photodiode. They often include mesas which have a comparatively small dimension in at least one direction substantially perpendicular to the direction of the semiconductor layer structure, for example, strip-shaped mesas having a width of approximately 1 to 10 $\mu$m.

Such an optoelectronic semiconductor device is known from European Patent 0 182 903 (date of publication 09-08-1989). The known semiconductor device comprises as the optoelectronic element a semiconductor diode laser of the so-called ridge waveguide type, in which the semiconductor layer structure comprises an active layer situated between two cladding layers which form a pn junction, on which active layer is provided an insulating layer in which a strip-shaped opening is present in which a mesa is formed by means of selective deposition. Over the mesa and the insulating layer is a metal layer which forms one of the connection conductors of the diode laser of which the mesa forms part. The other connection conductor is at the lower side of the substrate. Such a semiconductor device has many and important advantages, such as a simple manufacture, simple contacting, and low contact resistance.

A disadvantage of the known semiconductor device is that the deposition is not as selective as is desired, and that often parasitic polycrystalline material is formed during manufacture next to the mesa to be formed on an insulating layer which acts as a mask for the selective position. The parasitic deposition is undesirable since it is comparatively rough. Another disadvantage of the known device is, as has been shown in practice, that during cleaving thereof unevennesses are often formed on the cleavage surface, e.g. so-called cleavage steps, in the vicinity of, often just below the mesa, which is particularly undesirable since the optoelectronic element is situated at the area of the mesa. Another disadvantage of the known device was found to be that the height of the mesa is less easily adjustable. Moreover, the mesa has near its edges sometimes a considerable thickening, so that the mesa is rough, which forms a problem inter alia during the provision of a thin metal layer over the mesa which is to act as a connection conductor.

SUMMARY OF THE INVENTION

The invention has for its object inter alia to provide an optoelectronic semiconductor device in which the above disadvantages are entirely or at least partly obviated.

An optoelectronic semiconductor device of the kind described in the opening paragraph is for this purpose characterized in that at least one further mesa is present whose surface area seen in plan view is much greater than the surface area of the mesa, called first mesa hereinafter, and which is also formed by means of selective deposition simultaneously with the first mesa, at at least two opposing sides of the first mesa and separated from the first mesa by a groove. Selective deposition takes place over a much wider portion of the surface owing to the presence on one and the same semiconductor body surface of the further mesa, called second mesa hereinafter, which has a much greater surface area than the first mesa, for example, at least ten times greater. It is a surprise to find that much less parasitic polycrystalline deposition takes place thereby on the layer used as a mask, and thus that the selectivity of the deposition is improved. A possible explanation for this is that the presence of the second mesa not only reduces the masking surface area, but also that a greater portion of the mask bounds a region where the selective deposition takes place. Near these boundaries and above the mask, exhaustion takes place of the phase from which the selective deposition is carried out, the gas phase in the case of gas phase deposition or the liquid phase in the case of liquid phase deposition, owing to the fact that the semiconductor materials or their precursors are laterally sucked away in this phase towards the regions where the selective deposition takes place. As a result, the driving force for deposition in these boundary areas of the mask is smaller and less parasitic deposition of polycrystalline material takes place there. Since there is a groove between the first and the second mesa, the second mesa may fulfil a different function from that of the first, which forms part of the optoelectronic element. The second mesa may fulfil, for example, a mechanical function such as screening or supporting, or it may comprise other (opto)electronic components, such as transistors or a photodiode. This is possible because the semiconductor layers forming part of the mesas are interrupted at the groove. It was also surprisingly found in practice that considerably fewer cleavage steps occur during cleaving of the device according to the invention, at least in the immediate vicinity of the first mesa. The result is that the optoelectronic element, for example a semiconductor diode laser or a radiation guide, has considerably improved characteristics, among them a longer life.

A first important embodiment of a device according to the invention is characterized in that the width of the groove is approximately 2 to 50 $\mu$m. The height of the first mesa already turns out to be better adjustable with such a width, while its upper side is slightly flattened. Better results are obtained for a groove width which lies between 2 $\mu$m and approximately 20$\mu$m, while the best results are obtained with the smallest possible groove width. Further to the possible explanation given above, this result can also have the following explanation: the exhaustion of the phase from which the deposition is carried out, as described above, over (portions of) the mask is accompanied by an increased growth rate at least above the edges of the first mesa, where a local thickening then occurs. If the first mesa has a comparatively small dimension in a direction perpendicular to its thickness direction and perpendicular to the groove (which is often the case), an increased growth rate also occurs in the center above the mesa, so that the height of the mesa becomes quickly greater everywhere and the height is accordingly less easily adjustable, which is a disadvantage. These problems, as stated above, also occur in the known device. If the first mesa and the second mesa are sufficiently close together—it is found in practice—the increase in the rate of growth and the local thickening near the edges does not or substantially not occur at the first mesa. The maximum width of the groove for which the said problems do not occur is found to depend on the distance over which lateral supply of the III-V semiconductor materials or their precursors takes place in the phase from which the selective deposition is carried out. The maximum width of the groove is approximately twice the said distance. The exhaustion regions adjacent the first and the second mesa become smaller for a groove width which is smaller than or equal to this maximum width. As a result, the lateral supply in the gas phase decreases, and thus the rise in the rate of growth decreases. This rate then comes closer to the rate of growth in the case of non-selective deposition, and the upper side of the first mesa becomes flatter accordingly and the height of the first mesa better adjustable. So the maximum groove width depends on the technology used for the selective deposition. The value given here for this maximum width is found for devices in which organometallic vapor phase epitaxy (OMVPE) is used for the selective deposition. This is a particularly attractive deposition technology for various reasons, among which its suitability for use on an industrial scale. A minimum value for the groove width is determined by practical considerations, such as an effective separation of the mesas and the nature of the optoelectronic element, and it is approximately 2 $\mu$m.

In a preferred embodiment of a device according to the invention, the bottom of the groove is covered by an insulating layer. Such a layer has proved very suitable as a mask during carrying out of a selective deposition and preferably comprises silicon dioxide or silicon nitride. This layer may advantageously be used for contacting of the first mesa in that it is not removed after the selective deposition: indeed, the connection conductor may be provided on and over the first mesa without a critical alignment step thanks to the presence of the insulating layer on the bottom of the groove immediately next to the first mesa.

An important preferred embodiment of a semiconductor device according to the invention, in which the optoelectronic element comprises a semiconductor diode laser, the substrate is of a first conductivity type and is provided with a first connection conductor, the first mesa is strip-shaped and is bounded on either side by the groove and is separated by this groove from the second mesa, and is bounded in longitudinal direction by two parallel mirror surfaces which define a resonance cavity formed in the semiconductor structure, which structure comprises in that order a first cladding layer of the first conductivity type, an active layer, and a second cladding layer and a contact layer both of a second conductivity type opposed to the first conductivity type, is characterized in that the first mesa and the second mesa comprise the contact layer and the first mesa is provided with a second connection conductor.

In such an optoelectronic semiconductor device, the optoelectronic dement is a diode laser of the gain-guided type, which is desirable for a number of applications, such as optical disc systems or bar code readers. These semiconductor devices are often manufactured in the material system GaAs/AlGaAs ($\lambda$=0.6–0.9 $\mu$m) or InGaP/AlInGaP ($\lambda$=0.5–0.6 $\mu$m). Apart from the advantages listed above, this embodiment in which the second mesa has substantially the same height as the first, has the advantage that it is particularly suitable for so-called "upside down" mounting, for which there is a demand especially in the case of optoelectronic elements having a high dissipation level. A cooling body is then used with this form of mounting.

In a first modification of this embodiment, the first mesa and the second mesa also comprise a portion of the second cladding layer. When the first mesa and the second mesa comprise the greater portion of the second cladding layer, a device with a semiconductor diode laser of the index-guided type is created. This type is very suitable for application in, for example, optical communication systems. Such semiconductor devices are often manufactured in the material system InP/InGaAsP ($\lambda$=1.0–1.5 $\mu$m). When the first mesa and the second mesa only comprise a small portion of the second cladding layer, the semiconductor diode laser is still of the gain-guided type. A further insulating layer is preferably present over the second mesa and the second connection conductor extends over the insulating layer and the further insulating layer. As a result, the second connection conductor may be provided over the entire surface of the semiconductor body, which has several advantages, such as a simple manufacture and an easy and good contacting, while with a forward bias between the first and the second connection conductor a current runs almost exclusively through the first mesa where the diode laser is located.

In a second modification of the preferred embodiment described above, the first mesa comprises a portion of the second cladding layer and the second connection conductor extends over the insulating layer and the second mesa. This modification also has the characteristic that a (forward) current through the connection conductors does not run through the second mesa, but through the first mesa where the diode laser is located, in this case thanks to a Schottky barrier between the second connection conductor and the second cladding layer at the area of the second mesa.

In an important modification of all embodiments mentioned above, the first mesa and the second mesa each have a constricted portion near their base. This has the advantage for the first mesa that a small active region, and thus a low starting current, is combined with a great contact surface, and thus with a low contact and series resistance, at the optoelectronic element, for example, a diode laser. When the first mesa forms, for example, a (passive) radiation guide, the constriction has the advantage that the radiation present in the mesa-shaped radiation guide remains largely or partly separated from the semiconductor material situated below the first mesa, so that radiation absorption by that material is avoided. Furthermore, the constriction of the mesas has the advantage that the distance between the two mesas becomes very small, for example a few $\mu$m, without the necessity of placing the windows in the insulating layer, required for the selective deposition, very close together. The close proximity of the two mesas—i.e. the small width of the groove—has the advantages discussed in detail above. In this modification, the mesas will partly extend in lateral direction, often over an insulating layer which is present between the windows and acts as a mask for the selective deposition.

A method of the kind mentioned above, according to the invention, is characterized in that an insulating layer is provided on a substantially plane semiconductor body which comprises at least a semiconductor substrate, in which layer a first and a second window are made by means of photolithography and etching, whereby the second window bounds the first window at at least two opposing sides of the first window, is separated therefrom by a region of the insulating layer, and has a much greater surface area than said first window, after which a semiconductor layer structure of III–V semiconductor materials is provided by means of selective deposition, which structure forms a first mesa, which forms part of the optoelectronic element, and a second mesa in the first and second window, respectively. This method has, apart from the fact that it is comparatively simple, the important advantage that optoelectronic semiconductor devices with the desired characteristics can be obtained therewith, which devices have been described above in detail with reference to their advantages. The method according to the invention is simpler than the known method inter alia because no or substantially no polycrystalline depositions are created on the insulating layer. An extra etching stage for removing such depositions, accordingly, is redundant, this in contrast to the known method.

An important modification of the method according to the invention is characterized in that the insulating region is chosen to be strip-shaped and that its width is not chosen to be greater than twice the diffusion length of the III–V semiconductor material or a precursor thereof in the phase from which the selective deposition is carried out. In this way, as discussed above, an increase in the rate of growth relative to the rate of growth of uniform, non-selectively provided semiconductor layer structures is avoided or limited. The local thickening at the edges of the selectively deposited first mesa is also limited or even entirely avoided by this. In a method according to the invention, preferably, the selective deposition is carried out epitaxially and by means of organometallic vapor phase epitaxy (OMVPE), which is a deposition technology which is becoming more and more attractive industrially, while the width of the strip-shaped insulating region is chosen so as to lie between approximately 2 μm and 25 μm. A method according to the invention which is suitable for the manufacture of devices in which a semiconductor diode laser is chosen as the optoelectronic element is characterized in that, before the insulating layer is provided on the semiconductor substrate which is of a first conductivity type, a substantially plane semiconductor layer structure of III–V semiconductor materials is provided, which structure comprises in that order a first cladding layer of the first conductivity type, an active layer, a radiation guiding layer or at least a portion of a second cladding layer of a second conductivity type opposed to the first type, in that the semiconductor layer structure provided by means of selective position comprises at least a contact layer which is also of the second conductivity type, and in that after the selective deposition the substrate is provided with a first connection conductor and the first mesa is provided with a second connection conductor, after which the individual optoelectronic semiconductor devices are obtained by cleaving. Devices with semiconductor diode lasers of both the index-guided and the gain-guided type can be manufactured by means of modifications of this method. In the former case, the substantially plane semiconductor layer structure provided before the selective deposition comprises the layers situated below the second cladding layer and a small portion of the second cladding layer, while the remainder of the second cladding layer is formed during the selective deposition. In the latter case, the substantially plane semiconductor layer structure provided before the selective deposition comprises the major portion of the second cladding layer, while the remainder of this layer is formed during the selective deposition. The second connection conductor preferably extends over the second mesa. For this purpose, before the said connection conductor is provided, a further insulating layer is provided over the second mesa by means of, for example, pyrolitic deposition, which layer is removed at the area of the first mesa by photolithography and etching and comprises silicon oxide or silicon nitride. If also at least a portion of the second cladding layer is provided during the selective deposition, an attractive modification of a method according to the invention involves a removal of the contact layer at the area of the second mesa by means of photolithography and material-selective etching, upon which the second connection conductor is provided so as to extend over the two insulating layers.

BRIEF DESCRIPTION OF THE DRAWING

The invention will now be explained in more detail with reference to an embodiment and the accompanying drawing, in which.

Figure 1:
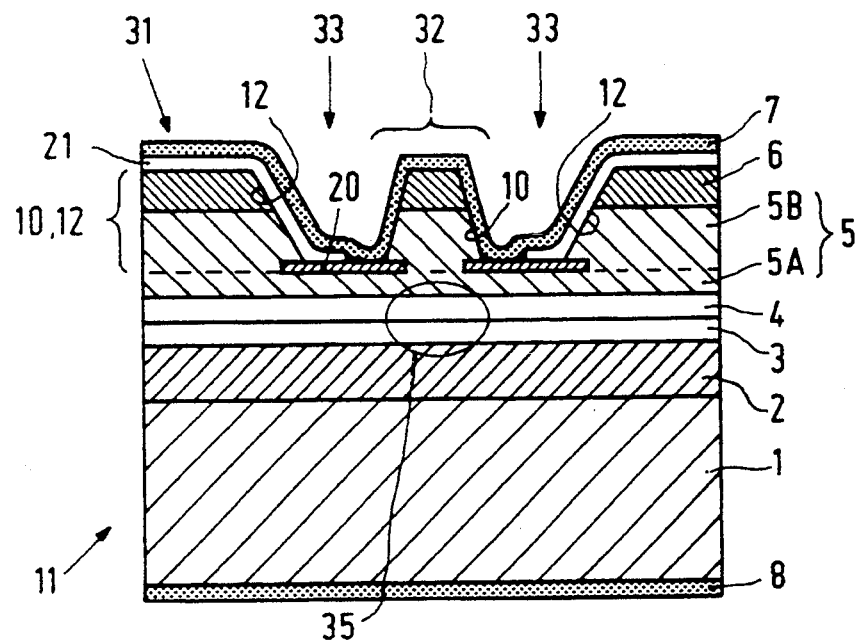
FIG. 1 shows diagrammatically and in cross-section an embodiment of an optoelectronic semiconductor device according to the invention, with a semiconductor diode laser as the optoelectronic element.
Figure 2:
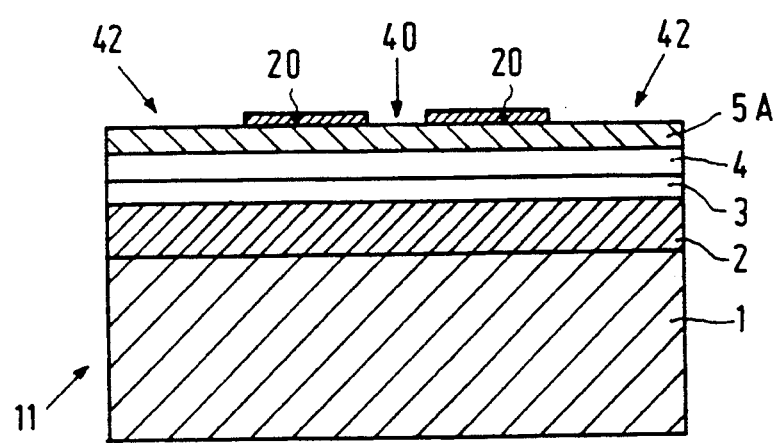
FIGS. 2 to 4 show diagrammatically in cross-section the optoelectronic semiconductor device of FIG. 1 in successive stages of manufacture by means of a method according to the invention.

The Figures are diagrammatic and not drawn to scale, while in particular the dimensions in the thickness direction are exaggerated for greater clarity. As regards the dimensions in lateral direction, the same as above holds for the central, first mesa, whereas the width of the mesas situated on either side thereof is in actual fact much greater than is suggested in the drawing. Corresponding parts are as a rule given the same reference numerals in the individual examples. Semiconductor regions of the same conductivity type are as a rule hatched in the same direction.

DESCRIPTION OF THE PREFERRED EMBODIMENTS

FIG. 1 shows in cross-section an embodiment of an optoelectronic semiconductor device according to the invention in which the optoelectronic element is a semiconductor diode laser of the ridge waveguide type. The device comprises a semiconductor body 11 with a substrate 1 of a first, here the n conductivity type provided with a first connection conductor 8 and in this embodiment consisting of monocrystalline indium phosphide. A semiconductor layer structure 2, 3, 4, 5A, 5B, 6 of III–V semiconductor materials is provided thereon, in the present example of InP or InGaAsP, while a first mesa 10 is formed at a surface 31 of the semiconductor body 11, which mesa in this example is strip-shaped with a longitudinal direction perpendicular to the plane of the drawing and forms part of an optoelectronic element 32, in this example a semiconductor diode laser. The length of the first mesa is approximately 300 μm, the width at the level of insulating regions 20 is approximately 4 μm, and immediately above that approximately 5 μm. According to the invention, a second mesa is present at at least two opposing sides of the first mesa 10, here the longitudinal sides perpendicular to the plane of the drawing, this second mesa comprising two separate mesas 12 here which are separated from the first mesa by a groove 33, here two grooves 33, which in plan view has a much greater surface area, i.e. twice 300×130 μm² here, than the first mesa, i.e. approximately 300×5 μm² here, and which is also formed by selective deposition and simultaneously with the first mesa. It is found in the manufacture of such a device that much less parasitic polycrystalline deposition takes place next to the first mesa on a layer used as a mask, here the insulating layer 20. In addition, such a device surprisingly has no or at least substantially no cleavage steps near the first mesa, which is an important prerequisite for a good operation of the optoelectronic element formed thereby. Other (opto)electronic components may be present in the second mesa. In the present example such components are not present and the second mesa acts, for example, as a protection for the first mesa during mechanical manipulation of the device, as a contact pad in fastening of a contact wire, or as a support surface in so-called "upside down" final assembly, where it is advantageous that the height of the second mesa is equal or at least substantially equal to that of the first mesa, i.e. approximately 1.5 μm as in the present example. The width of the groove 33, here the grooves 33, which lies preferably between 2 μm and 20 μm, is 14 μm in this example. Thanks to this comparatively small distance, no or at least substantially no increase in the growth rate or excessive growth takes place near the edges at the area of the first mesa, which is an important advantage. The semiconductor layer structure situated on a substrate 1 of a first conductivity type, here of n-InP, in the present example comprises in that order a first cladding layer 2 of the first, here the n conductivity type, an active layer 3, here of InGaAsP, a radiation guiding layer 4 of InGaAsP, and a portion 5A of a second cladding layer 5 of a second, opposite, here the p conductivity type and made of InP here. The insulating regions 20, here of silicon dioxide, which are situated on the bottom of the grooves 33, serve inter alia as masks for the selective deposition which comprises in this example the mesas 10, 12 with in this example in that order another, larger portion 5B of the second cladding layer 5, here also of p-InP, and a contact layer 6, also of the second, here the p-conductivity type and made of InGaAsP here. The composition and thicknesses of the various (semiconductor) layers are given in the Table below.

| Layer | (semiconductor) material | Type | Dope-conc. (at/cm³) | Thickness (μm) |
|---|---|---|---|---|
| 1 | InP | N | $2 \times 10^{18}$ | 300 |
| 2 | InP | N | $1 \times 10^{18}$ | 2 |
| 3 | In$_{0.73}$Ga$_{0.27}$As$_{0.60}$P$_{0.40}$ | — | — | 0.15 |
| 4 | In$_{0.89}$Ga$_{0.11}$As$_{0.25}$P$_{0.75}$ | — | — | 0.20 |
| 5A | InP | P | $1 \times 10^{18}$ | 0.25 |
| 5B | InP | P | $1 \times 10^{18}$ | 1.25 |
| 6 | In$_{0.53}$Ga$_{0.47}$As | — | $1 \times 10^{19}$ | 0.50 |

-continued

| Layer | (semiconductor) material | Type | Dope-conc. (at/cm³) | Thickness (μm) |
|---|---|---|---|---|
| 7 | Pt | | | 0.1 |
| 8 | Au—Ge—Ni | | | 0.1 |
| 20 | SiO$_2$ | | | 0.1 |
| 21 | Si$_3$N$_4$ | | | 0.1 |

In this example, the first mesa 10 is provided with a second connection conductor 7 and the second mesa, here the mesas 12, are provided with further insulating regions 21, here of silicon dioxide, while the second connection conductor 7 extends over the insulating layer 20 and the further insulating layer 21 which insulate the second connection conductor from subjacent semiconductor regions. The second connection conductor 7 can thus be provided in a single process step, i.e. a deposition step. Thanks to the presence of the insulating regions 20 and 21, current flows only through the first mesa 10, where the semiconductor diode laser is situated, when a forward bias voltage is applied across a pn junction between the connection conductors 7 and 8 formed by the cladding layers 2 and 5. The insulating layer 20, which is strip-shaped in this example, has a length of approximately 300 μm and a width of approximately 16 μm. The mesas 10 and 12 in this example each have a constricted portion near their bases, i.e. at the level of the insulating layer 20, over which in this example the semiconductor layers 5B and 6 partly extend in lateral direction. As a result, a large contact surface of the first mesa 10, and thus a low contact resistance, is combined with a narrow active region 35 of the diode laser, which is advantageous. It is also possible for the openings in the insulating layer 20, where the mesas 10 and 12 are formed, to be comparatively widely spaced apart, while nevertheless the eventual spacing between the mesa 10 and the mesa 12 is comparatively small, which leads not only to a tolerance in the dimensioning but also to a small width of the groove 33. In this example there is a radiation guiding layer 4 between the active layer 3 and the second cladding layer 5, so that the diode laser of the device in this example is particularly suitable for dissipating a high power. A particular advantage of the device in this example is that the portion 5A of the second cladding layer 5 is particularly thin and of uniform thickness, which thickness is readily and accurately adjustable, thanks to the fact that this portion 5A is formed by non-selective deposition. The index guiding of the diode laser 32 as a result can be accurately, uniformly, and reproducibly adjusted.

Figure 3:
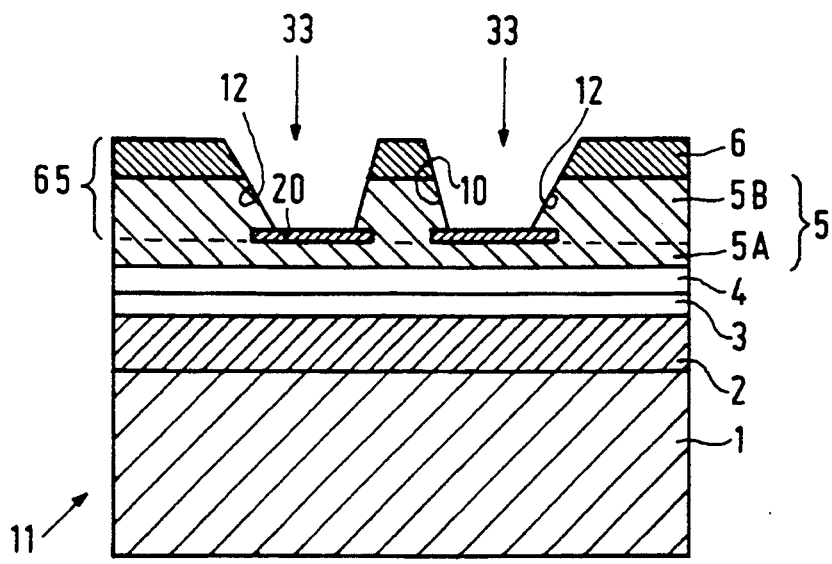
Figure 4:
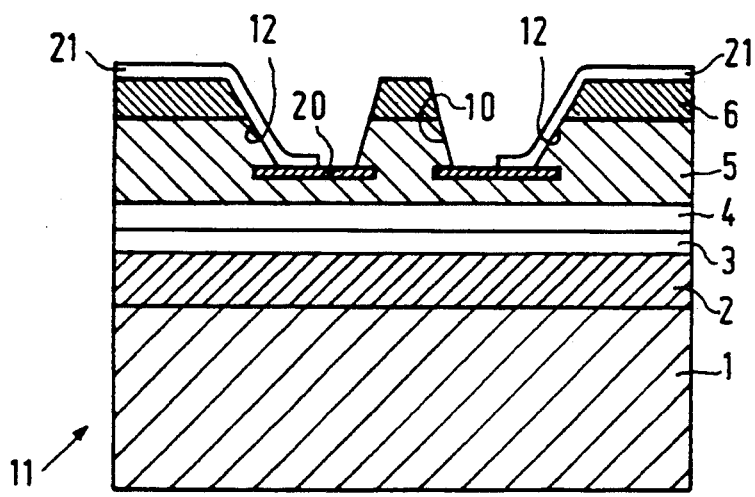

According to the invention, the optoelectronic device described is manufactured in the following way (see FIGS. 3, 4 and 5). The starting point is a (001) substrate 1 of monocrystalline n-type InP. The Table above gives data on the semiconductor material, its composition, conductivity type, doping concentration, and thicknesses of the substrate and of the other (semi)-conductor layers used in the method. By means of, for example, OMVPE, the following are provided thereon (see FIG. 3) in that order: a first cladding layer 2 of n-InP, an active layer 3, and a radiation guiding layer 4 of InGaAsP, and a portion 5A of a second cladding layer 5 of p-InP. According to the invention, an insulating layer 20, here of silicon dioxide, is provided thereon, in which layer a first window 40, here a strip-shaped window, and a second window 42, here comprising two strip-shaped windows, are made by photolithography and etching, whereby according to the invention the second window 42 bounds the first window 41 at at least two opposing sides, here the longitudinal sides of the first window 41 which lie approximately perpendicular to the plane of the drawing, is separated from this first window by a region 20, also strip-shaped here, of the insulating layer 20, which comprises two regions 20 here, and has a much greater surface area than the first window 40; Then (see FIG. 3), according to the invention, a semiconductor layer structure 65, here a second portion 5B of the second cladding layer 5 and a contact layer 6 of III-V semiconductor materials, here InP for the portion 5B and InGaAsP for layer 6, are provided by means of selective deposition, which structure forms a first mesa 10, which forms part of the optoelectronic element 32, here a diode laser, and a second mesa 12 in the first window 40 and the second window 42, respectively. Such a method has the advantage that less parasitic polycrystalline deposition is created, so that a removal thereof is not necessary. Preferably, the width of the strip-shaped regions 20 is chosen to be smaller than twice the diffusion length of the III-V semiconductor material or a precursor thereof, here the hydride of one or several V-elements and the alkyde of one or several III- elements, in the phase from which the selective deposition is carried out, here the gas phase. An increase in the growth rate or excessive growth near the edges at the area of the first mesa is particularly avoided by this, which results in better semiconductor devices and a better process control. If the selective deposition technology is OMVPE, the width of the insulating region is preferably chosen to lie between approximately 2 $\mu$m and 25 $\mu$m. In this example, this width is approximately 16 $\mu$m. The longitudinal direction of the insulating region 20, which is strip-shaped here, and thus the longitudinal direction of the windows 40 and 42, also strip-shaped here, is chosen to be parallel to a direction belonging to the {110} group, such as the (110) direction or the (1-11) direction, but preferably the (110) direction. Then (see FIG. 4) a further insulating layer 21, here also of silicon dioxide, is provided on the semiconductor body by, for example, sputtering, and the layer 21 is removed at the area of the first mesa 10 and of an adjacent portion of the insulating layer 21 by photolithography and etching. If the insulating layer 20 and the further insulating layer 21 comprise different materials, material-selective etching may be used for this. After the semiconductor body 11 has been provided with a first connection conductor 8 and a second connection conductor 7 at the upper and lower side, respectively, and the resulting device (see FIG. 1) has been cleft, the optoelectronic semiconductor device of the example as discussed above is obtained in a form suitable for final mounting or further processing.

The invention is not limited to the embodiments given, since many modifications and variations are possible to those skilled in the art within the scope of the invention. Thus other semiconductor materials or other compositions than those in the examples may be used. For example, devices in the GaAs/AlGaAs or InGaP/InAlGaP systems may be manufactured as well as in the InP/InGaAsP system. The conductivity types may also be all (simultaneously) be replaced by their opposites. If the optoelectronic element comprises a semiconductor diode laser, the latter may be of the gain-guided type as well as of the index-guided type. The invention is not limited to devices having a diode laser as the optoelectronic element, but the device may also comprise an LED or radiation guide or a different element which is realized by means of a first mesa. Neither is the invention limited to devices having a strip-shaped first mesa. This mesa may alternatively be plate-shaped or even round. In these cases also the best results are achieved when the first mesa has a small dimension in one or several directions substantially perpendicular to the thickness direction. Thus the first mesa may comprise a so-called quantum box with lateral dimensions of, for example, approximately 0.01 to 0.1 $\mu$m.

The device according to the invention in the given example does not comprise any further (opto)electronic elements in the second mesa. This, however, is possible. The second mesa may comprise transistors, photodiodes, or radiation guides. Finally, it should be noted that besides OMVPE as a method of providing the semiconductor layers also LPE (=Liquid Phase Epitaxy), MBE (=Molecular Beam Epitaxy) or VPE (=Vapour Phase Epitaxy) may be used. This is true both for the semiconductor layers which are provided during the selective deposition and for the other semiconductor layers.

We claim:

1. An optoelectronic semiconductor device having an optoelectronic element comprising a semiconductor body provided with a semiconductor substrate and a substantially plane semiconductor layer structure of III-V semiconductor materials superimposed on said substrate, and a first mesa formed at a surface of said semiconductor body by means of selective deposition and forming part of said optoelectronic element, characterized in that a second mesa having two mesa portions is formed by means of selective deposition simultaneously with said first mesa, said two mesa portions being present at at least two opposing sides of said first mesa and having surface areas, which, seen in plan view, are greater than a surface area of said first mesa and are separated from said first mesa by grooves, and insulating layer portions beneath said grooves and extending laterally at least partially beneath said first and second mesas, each mesa portion having a constricted portion beneath said mesa and near its base, the lateral extent of said constricted portion being defined at least partly by at least one of said insulating layer portions.

2. A semiconductor device as claimed in claim 1, characterized in that a width of each said groove is approximately 2 to 50 $\mu$m.

3. A semiconductor device as claimed in claim 1, characterized in that a width of each said groove is approximately 2 to 20 $\mu$m.

4. A semiconductor device as claimed in claim 1, characterized in that a height of each second mesa portion, is approximately equal to, and preferably not smaller than a height of the first mesa.

5. A semiconductor device as claimed in claim 1, characterized in that a bottom of each said groove is covered by an insulating layer.

6. A semiconductor device as claimed in claim 5, in which the optoelectronic element comprises a semiconductor diode laser, the substrate is of a first conductivity type and is provided with a first connection conductor, the first mesa is strip-shaped and is bounded on either side by one of said grooves and is separated by these grooves from the second mesa portions and is bounded in the longitudinal direction by two parallel minor surfaces which define a resonance cavity formed in the semiconductor structure, which structure comprises in the following order a first cladding layer of the first conductivity type, an active layer, and a second cladding layer and a contact layer, both said second cladding layer and said contact layer being of a second conductivity type opposed to the first conductivity type, characterized in that the first mesa and the second mesa portions comprise the contact layer and the first mesa is provided with a second connection conductor.

7. A semiconductor device as claimed in claim 6, characterized in that the first mesa and the second mesa portions comprise a portion of the second cladding layer.

8. A semiconductor device as claimed in claim 6, characterized in that the second mesa portions are covered by a further insulating layer and the second connection conductor extends over the insulating layer and the further insulating layer.

9. A semiconductor device as claimed in claim 6, characterized in that the first mesa portions comprises a portion of the second cladding layer and the second connection conductor extends over the insulating layer and the second mesa.

10. A semiconductor device as claimed in any one of the claims 6, characterized in that a radiation guiding layer is present between the active layer and the second cladding layer.

* * * * *